US012684741B2

(12) United States Patent
Hu et al.

(10) Patent No.: US 12,684,741 B2
(45) Date of Patent: Jul. 14, 2026

(54) VEHICLE DEVICE

(71) Applicant: PRIMAX ELECTRONICS LTD.,
Taipei City (TW)

(72) Inventors: Chih-Wei Hu, Taipei City (TW);
Shih-Hung Yu, Taipei City (TW);
Wen-Pin Lin, Taipei City (TW)

(73) Assignee: PRIMAX ELECTRONICS LTD.,
Taipei City (TW)

( * ) Notice: Subject to any disclaimer, the term of this
patent is extended or adjusted under 35
U.S.C. 154(b) by 278 days.

(21) Appl. No.: 18/594,030

(22) Filed: Mar. 4, 2024

(65) Prior Publication Data

US 2025/0254844 A1     Aug. 7, 2025

(30) Foreign Application Priority Data

Feb. 6, 2024     (TW) .................................. 113104807

(51) Int. Cl.
H05K 7/20 (2006.01)
H05K 5/02 (2006.01)
(52) U.S. Cl.
CPC ....... H05K 7/20863 (2013.01); H05K 5/0214
(2022.08)
(58) Field of Classification Search
CPC ............. H05K 5/0214; H05K 7/20863; H05K
7/20154; H05K 5/0056; H05K 5/0212;
H05K 5/0213; H05K 7/20136; H05K
7/20145
See application file for complete search history.

(56) References Cited

U.S. PATENT DOCUMENTS

| | | | | |
|---|---|---|---|---|
| 7,051,791 | B2 * | 5/2006 | Hashimoto ............. | F04D 29/30 |
| | | | | 257/E23.099 |
| 2003/0066627 | A1 * | 4/2003 | Lin .................... | H05K 7/20172 |
| | | | | 165/104.11 |
| 2007/0066207 | A1 * | 3/2007 | Smith .................. | B60H 1/3226 |
| | | | | 454/69 |
| 2008/0101041 | A1 * | 5/2008 | Chang .................. | H05K 5/0214 |
| | | | | 361/728 |
| 2020/0159296 | A1 * | 5/2020 | Zhu .................... | H05K 7/20145 |
| 2023/0384844 | A1 * | 11/2023 | Higashino .......... | H05K 7/20154 |
| 2024/0081018 | A1 * | 3/2024 | Yosho ..................... | G06F 1/203 |

FOREIGN PATENT DOCUMENTS

WO     WO-2022249878 A1 * 12/2022   ........... H01L 23/467

* cited by examiner

Primary Examiner — Robert J Hoffberg
Assistant Examiner — Jamil Alexander Decker
(74) Attorney, Agent, or Firm — WPAT, PC

(57) ABSTRACT

A vehicle device includes a heat sink, a retaining wall, at
least one electronic component, a fan and an upper cover.
The heat sink has a drainage portion and an electronic
component accommodating portion, in which the drainage
portion has a fan accommodating portion. The retaining wall
isolates the drainage portion and the electronic component
accommodating portion. The at least one electronic compo-
nent is disposed over the electronic component accommo-
dating portion. The fan is disposed over the fan accommo-
dating portion. The upper cover covers the heat sink, the
retaining wall, the at least one electronic component and the
fan, and has through holes and at least one first drain outlet,
in which the through holes are aligned with the drainage
portion, and the at least one first drain outlet is adjacent to
an edge portion of the drainage portion and away from the
fan.

7 Claims, 7 Drawing Sheets

150

150d

150c

150b

1113b

150a

VEHICLE DEVICE

FIELD OF THE INVENTION

The present disclosure relates to a vehicle device, and in particular, to a vehicle device capable of draining water.

BACKGROUND OF THE INVENTION

Currently, casings of some vehicle devices are provided with holes. However, liquid may enter the vehicle devices through the holes (e.g., during car washing or heavy rain), causing damage to electronic components inside the vehicle devices.

SUMMARY OF THE INVENTION

The present invention provides a vehicle device, which includes a heat sink, a retaining wall, at least one electronic component, a fan and an upper cover. The heat sink has a drainage portion and an electronic component accommodating portion, in which the drainage portion has a fan accommodating portion. The retaining wall isolates the drainage portion and the electronic component accommodating portion. The at least one electronic component is disposed over the electronic component accommodating portion. The fan is disposed over the fan accommodating portion. The upper cover covers the heat sink, the retaining wall, the at least one electronic component and the fan, and has a plurality of through holes and at least one first drain outlet, in which the through holes are aligned with the drainage portion, and the at least one first drain outlet is adjacent to an edge portion of the drainage portion and away from the fan.

In some embodiments of the present disclosure, the retaining wall and the upper cover are integrally formed, or the retaining wall and the heat sink are integrally formed.

In some embodiments of the present disclosure, the drainage portion further has a fin portion adjacent to the fan accommodating portion, and the fin portion has a plurality of fins to define a plurality of drainage channels, and two ends of each of the fins are respectively close to the fan and the at least one first drain outlet.

In some embodiments of the present disclosure, the vehicle device further includes a cover plate disposed between the fin portion of the drainage portion and the upper cover and covering the fin portion of the drainage portion, in which the through holes are aligned with the cover plate and the fan accommodating portion.

In some embodiments of the present disclosure, the drainage portion further has a connection portion adjacent to the fin portion, and the connection portion has a slope portion and a pivot portion, and the slope portion is connected between the fin portion and the pivot portion, and the slope portion and the upper cover jointly define a second drain outlet.

In some embodiments of the present disclosure, the cover plate further covers a portion of the slope portion close to the fin portion.

In some embodiments of the present disclosure, the drainage portion further has a groove portion adjacent to the fan accommodating portion, and the groove portion has a third drain outlet penetrating the groove portion, and a bottom of the groove portion is lower than a bottom of the fan accommodating portion.

In some embodiments of the present disclosure, the upper cover further has at least one first ventilation opening disposed over the at least one first drain outlet.

In some embodiments of the present disclosure, the vehicle device further includes an antenna bracket disposed between a portion of the fin portion close to the at least one first drain outlet and a portion of the upper cover close to the at least one first drain outlet, in which the antenna bracket has at least one fourth drain outlet facing the at least one first drain outlet.

In some embodiments of the present disclosure, the vehicle device further includes a buffer member covering the portion of the fin portion close to the at least one first drain outlet and a portion of the antenna bracket.

BRIEF DESCRIPTION OF THE DRAWINGS

Aspects of the present disclosure are best understood from the following embodiments, read in conjunction with accompanying drawings. However, it should be understood that in accordance with common practice in the industry, various features have not necessarily been drawn to scale. Indeed, shapes of the various features may be suitably adjusted for clarity, and dimensions of the various features may be arbitrarily increased or decreased.

DETAILED DESCRIPTION OF THE PREFERRED EMBODIMENT

Figure 1:
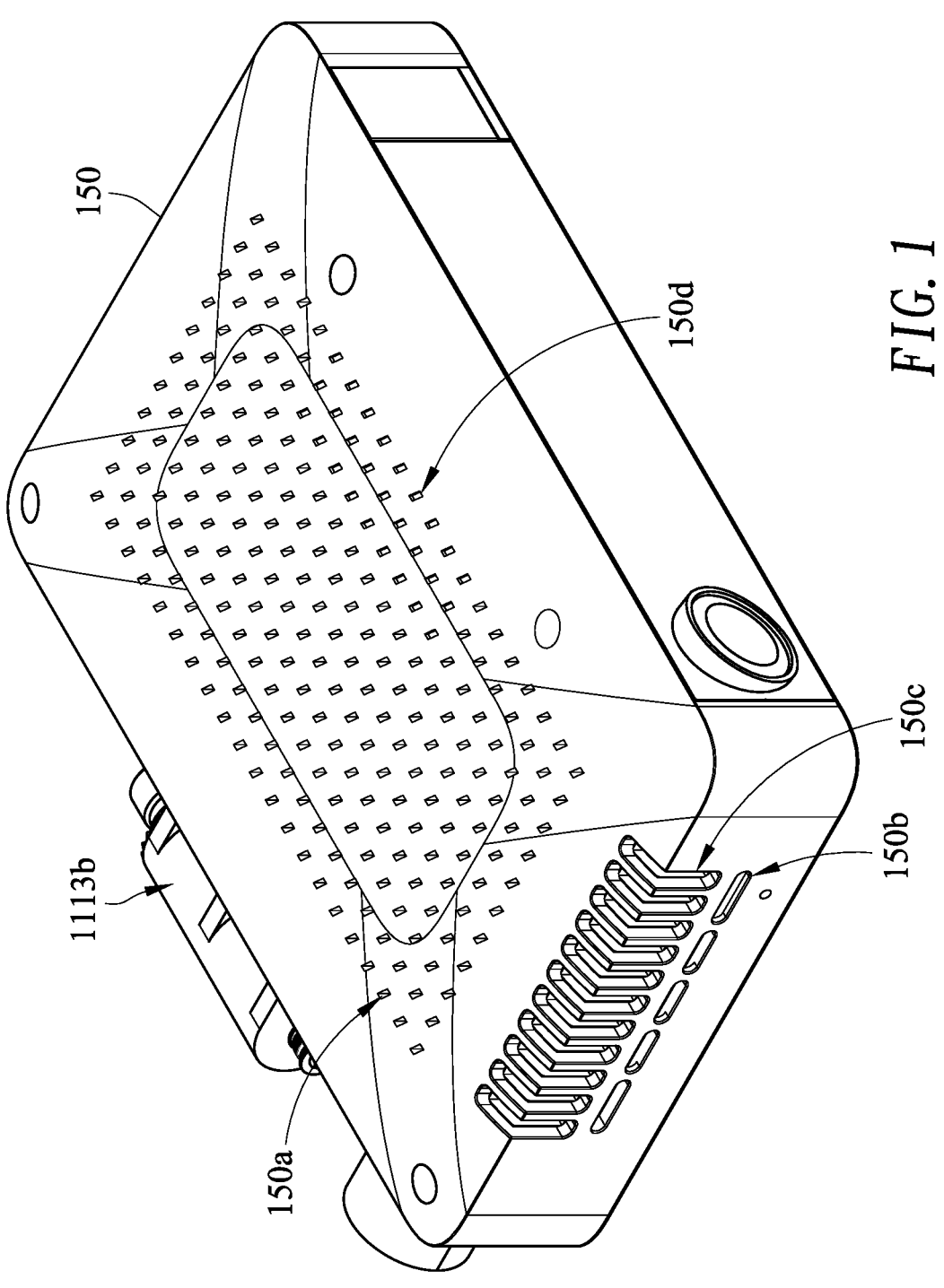
FIG. 1 is a three-dimensional view of a vehicle device according to an embodiment of the present invention.

The advantages and features of the present disclosure and the method for achieving the same will be described in more detail with reference to exemplary embodiments and accompanying drawings to make it easier to understand. However, the present disclosure can be implemented in different forms and should not be construed as being limited to the embodiments set forth herein. On the contrary, for those skilled in the art, the provided embodiments will make this disclosure more thorough, comprehensive and complete to convey the scope of the present disclosure.

The spatially relative terms in the text, such as "beneath" and "over", are used to facilitate the description of the relative relationship between one element or feature and another element or feature in the drawings. The true meaning of the spatially relative terms includes other orientations. For example, when the drawing is flipped up and down by 180°, the relationship between the one element and the other element may change from "beneath" to "over." The spatially relative descriptions used herein should be interpreted the same.

As mentioned in background of the invention, casings of some vehicle devices are provided with holes. However, liquid may enter the vehicle devices through the holes (e.g., during car washing or heavy rain), causing damage to electronic components inside the vehicle devices. Accordingly, the present invention provides a vehicle device to solve aforementioned issues. The vehicle device of the present invention includes a heat sink with a drainage portion and an electronic component accommodating portion, a retaining wall isolating the drainage portion and the electronic component accommodating portion, at least one electronic component, a fan and an upper cover, in which the upper cover has a plurality of through holes and at least one first drain outlet adjacent to an edge portion of the drainage portion and away from the fan. After liquid enters the drainage portion through the through holes, it can be discharged from the at least one first drain outlet, and due to the existence of the retaining wall, the liquid entering the drainage portion will not contact the electronic component, so damage to the electronic component can be effectively avoided. Various embodiments of the vehicle device of the present invention will be described in detail below.

Figure 2:
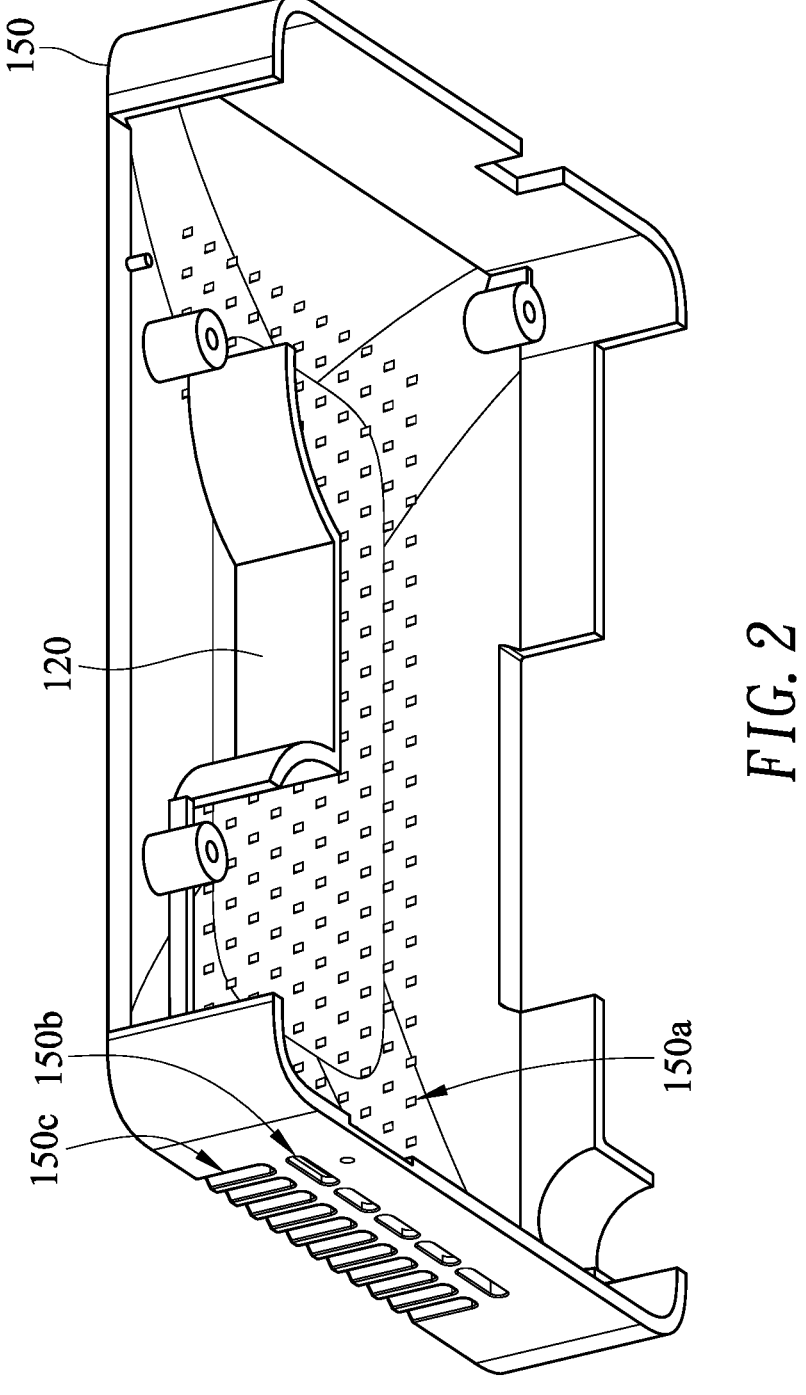
FIG. 2 is a three-dimensional view of an upper cover and a retaining wall according to an embodiment of the present invention.
Figure 3:
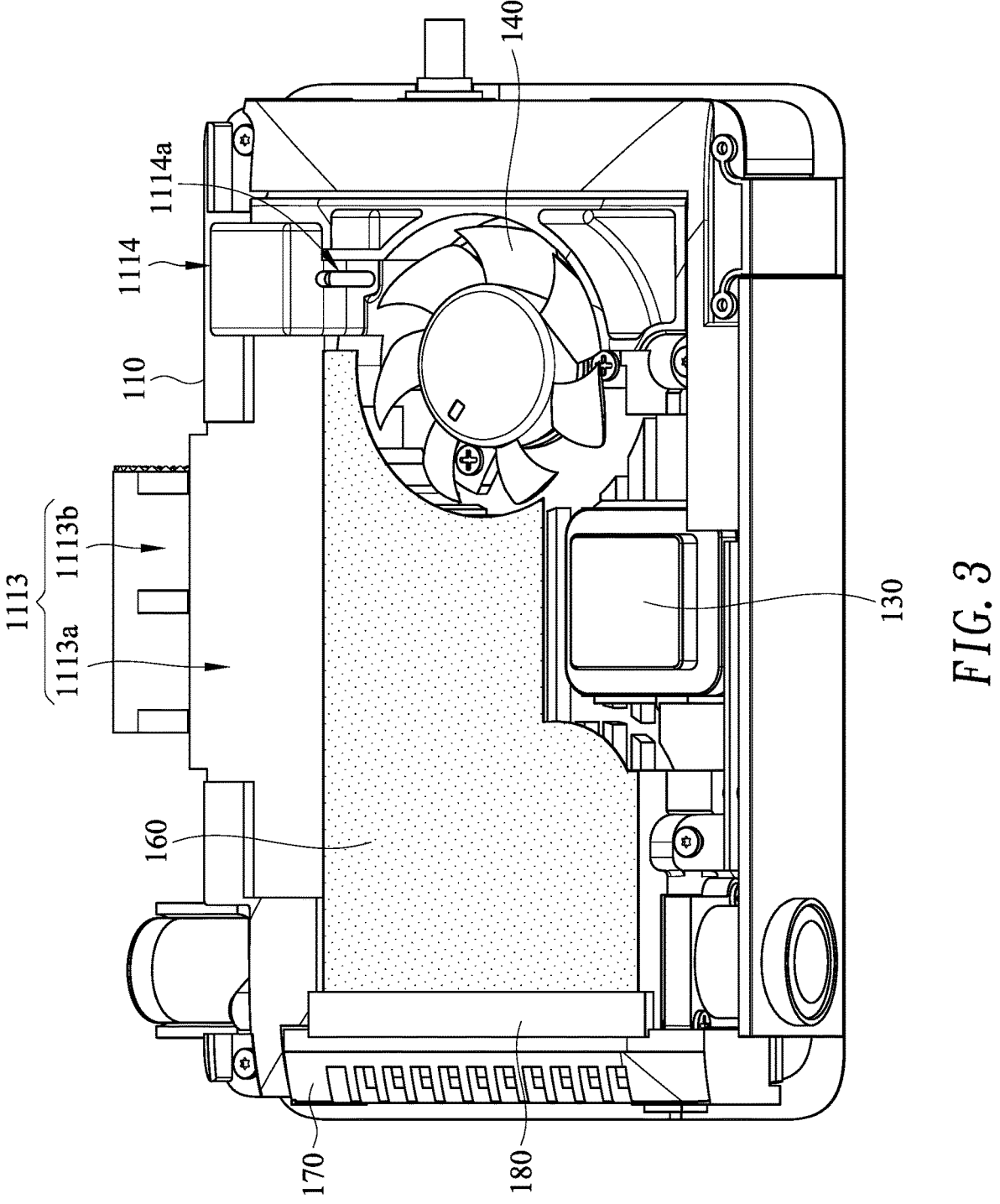
FIG. 3 is a three-dimensional view of a vehicle device (an upper cover is not shown) according to an embodiment of the present invention.
Figure 4:
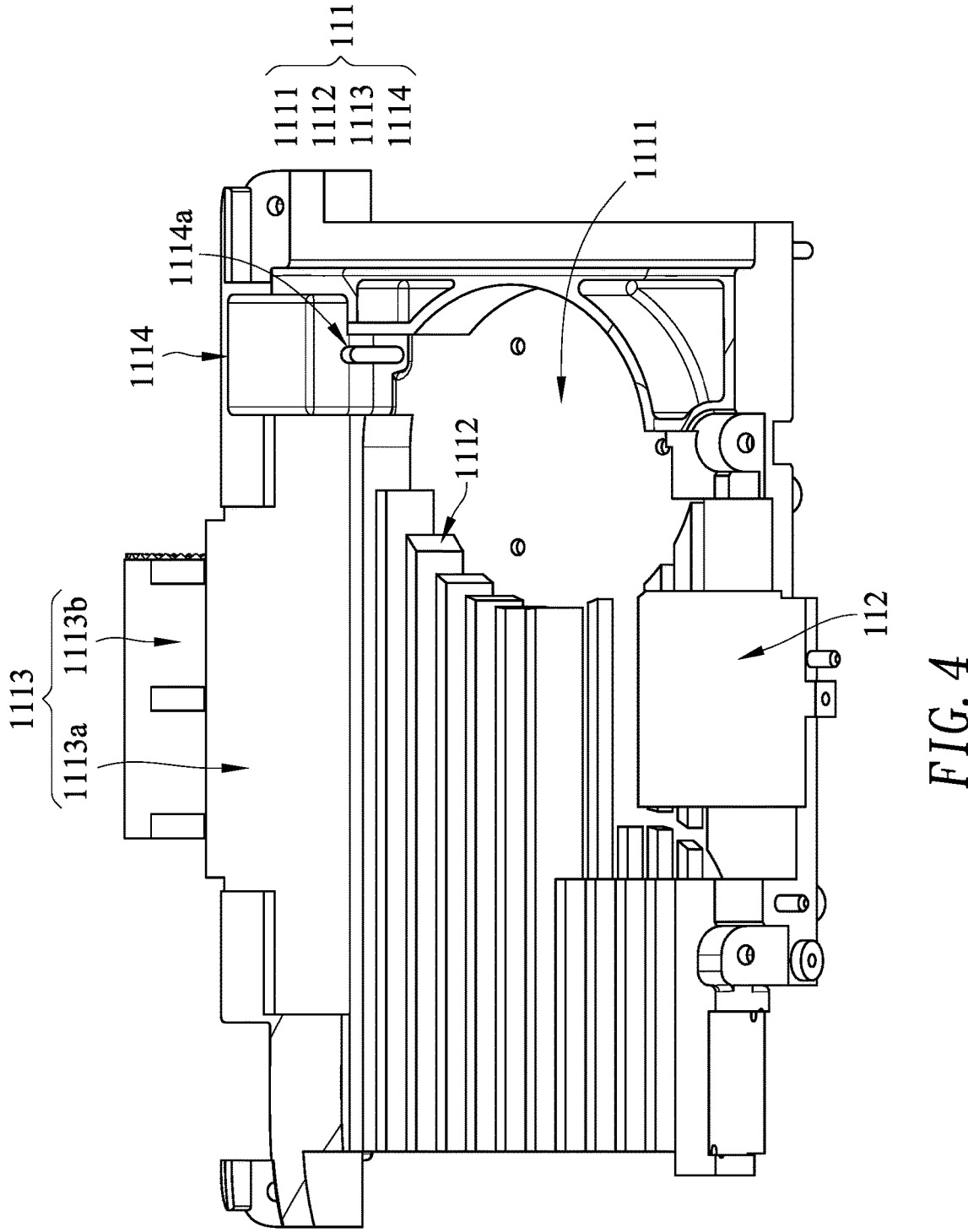
FIG. 4 is a three-dimensional view of a heat sink according to an embodiment of the present invention.
Figure 5:
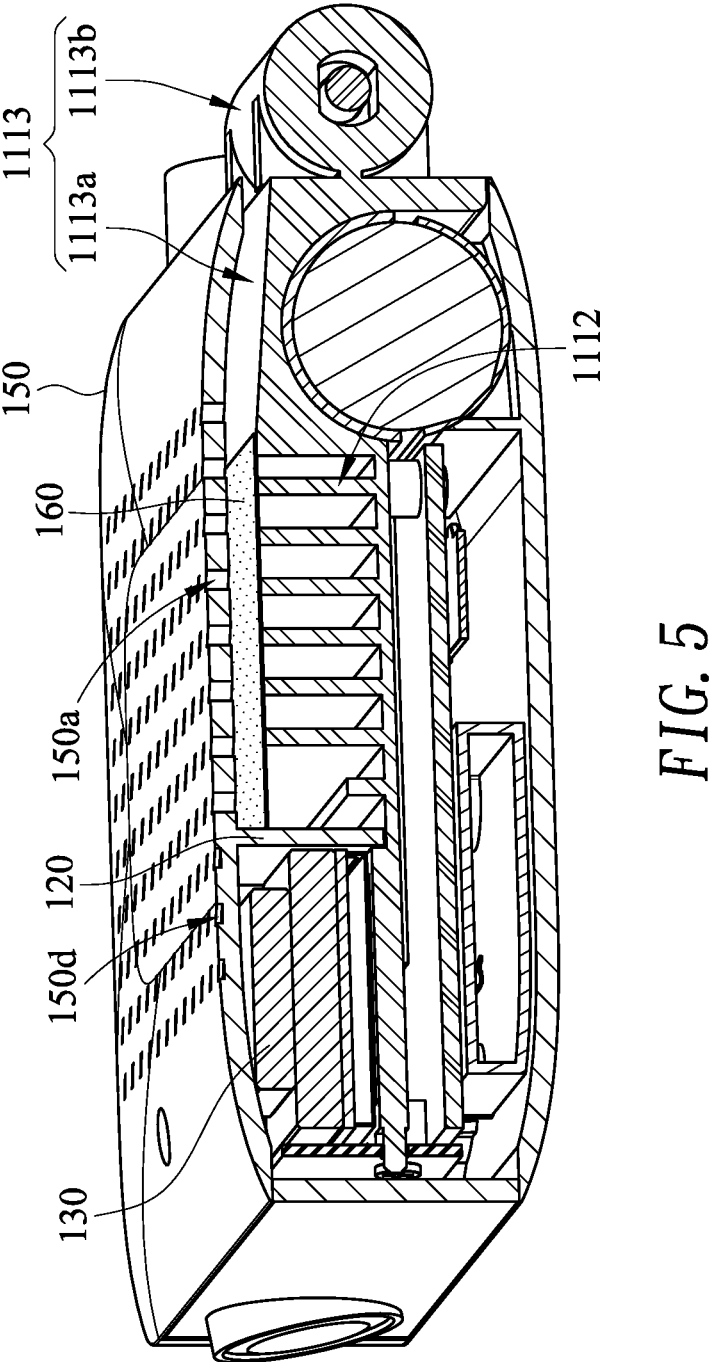
FIG. 5 is a cross-sectional view of a vehicle device according to an embodiment of the present invention.

FIG. 1 is a three-dimensional view of a vehicle device according to an embodiment of the present invention. FIG. 2 is a three-dimensional view of an upper cover and a retaining wall according to an embodiment of the present invention. FIG. 3 is a three-dimensional view of a vehicle device (an upper cover is not shown) according to an embodiment of the present invention. FIG. 4 is a three-dimensional view of a heat sink according to an embodiment of the present invention. FIG. 5 is a cross-sectional view of a vehicle device according to an embodiment of the present invention. As shown in FIGS. 1 to 5, the vehicle device includes a heat sink 110, a retaining wall 120, at least one electronic component 130, a fan 140 and an upper cover 150. In some embodiments, the vehicle device is a driving recorder.

As shown in FIG. 4, the heat sink 110 has a drainage portion 111 and an electronic component accommodating portion 112. The drainage portion 111 is configured to receive liquid entering through through holes of the upper cover (e.g., the through holes 150a of the upper cover 150 shown in FIGS. 1 and 2) and then discharge the liquid. The drainage portion 111 has a fan accommodating portion 1111, which is configured to accommodate a fan (e.g., the fan 140 shown in FIG. 3). The electronic component accommodating portion 112 is configured to accommodate an electronic component (e.g., the electronic component 130 shown in FIGS. 3 and 5), so as to absorb heat generated when the electronic component 130 operates to help the electronic component 130 dissipate heat. In some embodiments, the heat sink 110 includes metal. In some embodiments, the heat sink 110 is made of one or more metals.

As shown in FIGS. 2 to 4, the retaining wall 120 isolates the drainage portion 111 and the electronic component accommodating portion 112. In some embodiments, the retaining wall 120 isolates the fan accommodating portion 1111 and the electronic component accommodating portion 112. In some embodiments, the retaining wall 120 and the upper cover 150 are integrally formed (as shown in FIG. 2), or the retaining wall 120 and the heat sink 110 are integrally formed (not shown).

As shown in FIGS. 3 to 5, the at least one electronic component 130 is disposed over the electronic component accommodating portion 112. Due to the existence of the retaining wall 120, the liquid entering the drainage portion 111 will not contact the electronic component 130, thereby effectively preventing damage to the electronic component 130.

As shown in FIGS. 3 and 4, the fan 140 is disposed over the fan accommodating portion 1111. The fan 140 is configured to create airflow to help the heat sink 110 dissipate heat.

As shown in FIGS. 1 to 5, the upper cover 150 covers the heat sink 110, the retaining wall 120, the at least one electronic component 130 and the fan 140. The upper cover 150 has a plurality of through holes 150a and at least one first drain outlet 150b. The through holes 150a are aligned with the drainage portion 111. The at least one first drain outlet 150b is adjacent to an edge portion of the drainage portion 111 and away from the fan 140. After the liquid enters the drainage portion 111 from the through holes 150a, it can be discharged from the at least one first drain outlet 150b. In some embodiments, as shown in FIG. 1, the upper cover 150 further has a plurality of blind holes 150d aligned with the electronic component accommodating portion 112.

In some embodiments, as shown in FIGS. 1 to 5, the drainage portion 111 further has a fin portion 1112 adjacent to the fan accommodating portion 1111, and the fin portion 1112 has a plurality of fins (as shown in FIG. 4) to define a plurality of drainage channels, and two ends of each of the fins are respectively close to the fan 140 and the at least one first drain outlet 150b. In some embodiments, as shown in FIGS. 2 to 4, the retaining wall 120 isolates the fin portion 1112 and the electronic component accommodating portion 112.

In some embodiments, the through holes 150a are aligned with the fin portion 1112 and the fan accommodating portion 1111. In some embodiments, the liquid entering the fin portion 1112 or the fan accommodating portion 1111 can be blown to the drainage channels by the airflow generated by the fan 140, and then be discharged from the first drain outlet 150b. In some embodiments, the liquid (e.g., water) entering the fin portion 1112 or the fan accommodating portion 1111 can absorb heat of the heat sink 110 and transform into gas (e.g., water vapor). In some embodiments, as shown in FIGS. 1 and 2, the upper cover 150 further has at least one first ventilation opening 150c disposed over the at least one first drain outlet 150b to discharge the air flow generated by the fan 140 or the above-mentioned water vapor.

In some embodiments, as shown in FIGS. 3 to 5, the vehicle device further includes a cover plate 160 disposed between the fin portion 1112 of the drainage portion 111 and the upper cover 150, and covers the fin portion 1112 of the drainage portion 111, and the through holes 150a are aligned with the cover plate 160 and the fan accommodating portion 1111.

In some embodiments, as shown in FIGS. 3 to 5, the drainage portion 111 further has a connection portion 1113 adjacent to the fin portion 1112. In some embodiments, the connecting portion 1113 is also adjacent to a portion of the fan accommodating portion 1111. In some embodiments, the connection portion 1113 has a slope portion 1113a and a pivot portion 1113b. The slope portion 1113a is connected between the fin portion 1112 and the pivot portion 1113b. The slope portion 1113a and the upper cover 150 jointly define a second drain outlet (not marked, as shown in FIG. 5). In some embodiments, the pivot portion 1113b is configured to pivot a bracket (not shown).

In some embodiments, as shown in FIG. 5, the liquid entering from the through holes 150a to a top of the cover plate 160 will flow to the slope portion 1113a, and then be discharged from the second drain outlet. In some embodiments, the cover plate 160 further covers a portion of the slope portion 1113a close to the fin portion 1112. In some embodiments, a height of the portion of the slope portion 1113*a* close to the fin portion 1112 is the same as a height of the fin portion 1112.

In some embodiments, as shown in FIGS. 3 and 4, the drainage portion 111 further has a groove portion 1114 adjacent to the fan accommodating portion 1111, and the groove portion 1114 has a third drain outlet 1114*a* through the groove portion 1114, and a bottom of the groove portion 1114 is lower than a bottom of the fan accommodating portion 1111. In some embodiments, the liquid entering the fan accommodating portion 1111 may flow to the groove portion 1114 and then be discharged from the third drain outlet 1114*a*.

Figure 6:
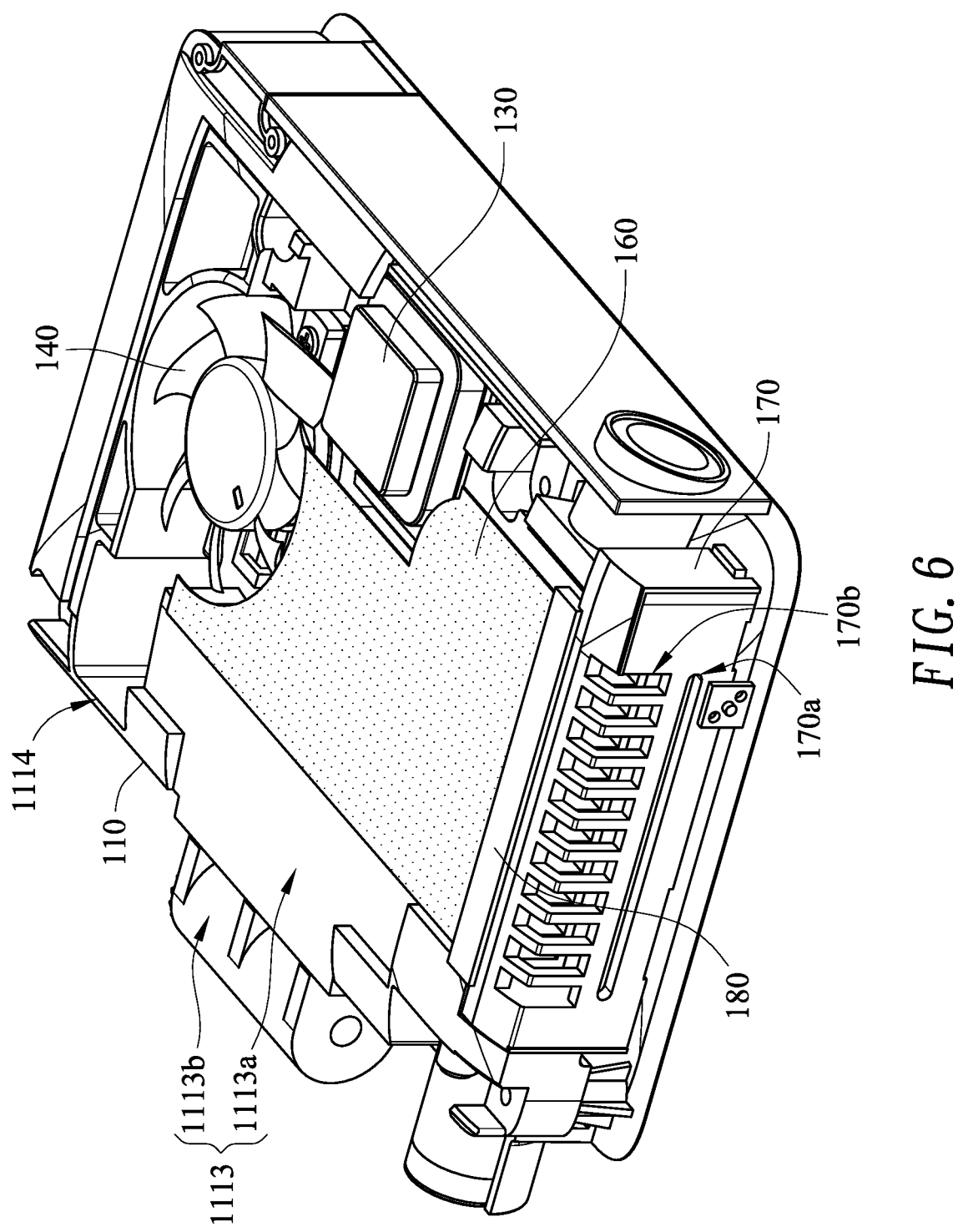
FIG. 6 is a three-dimensional view of a vehicle device (an upper cover is not shown) according to an embodiment of the present invention.
Figure 7:
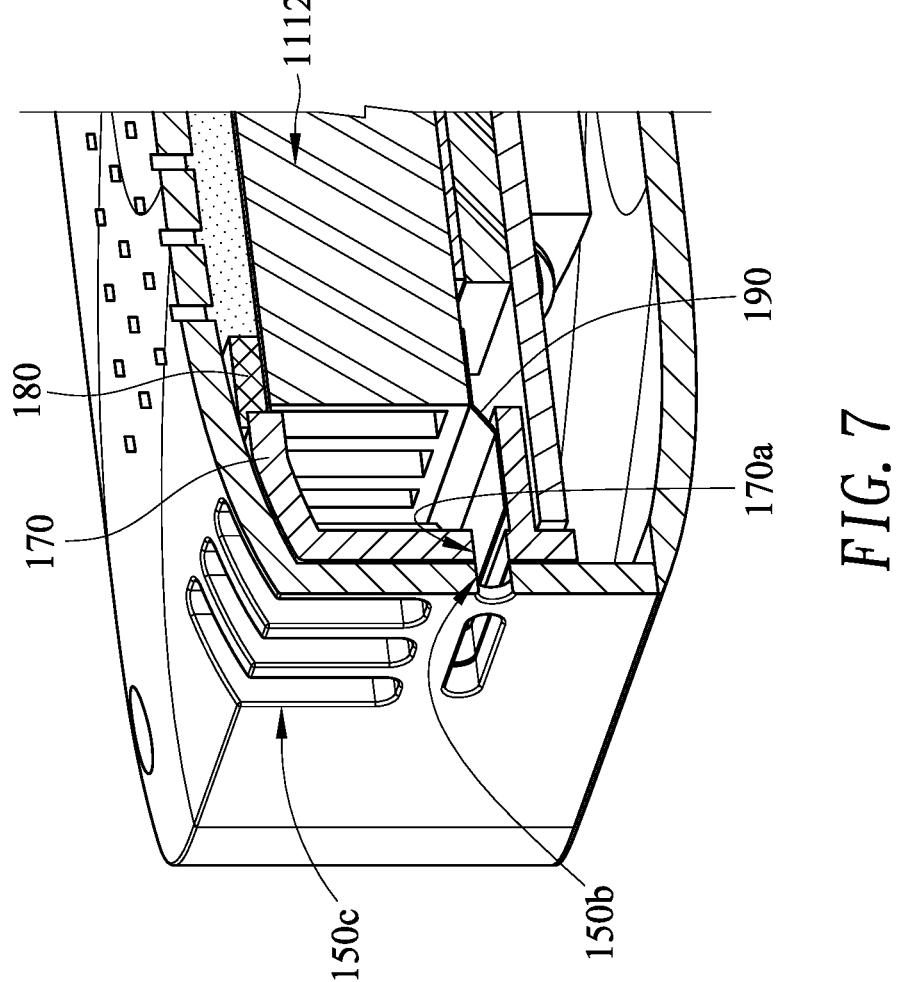
FIG. 7 is a cross-sectional view of part of a vehicle device according to an embodiment of the present invention.

FIG. 6 is a three-dimensional view of a vehicle device (an upper cover is not shown) according to an embodiment of the present invention. FIG. 7 is a cross-sectional view of part of a vehicle device according to an embodiment of the present invention.

In some embodiments, as shown in FIGS. 6 and 7, the vehicle device further includes an antenna bracket 170 disposed between a portion of the fin portion 1112 close to the at least one first drain outlet 150*b* and a portion of the upper cover 150 close to the at least one first drain outlet 150*b*. The antenna bracket 170 has at least one fourth drain outlet 170*a* facing the at least one first drain outlet 150*b*. In some embodiments, the antenna bracket 170 further has at least one second ventilation opening 170*b* corresponding to the at least one first ventilation opening 150*c* of the upper cover 150. In some embodiments, an antenna (not shown) is embedded in the antenna bracket 170.

In some embodiments, as shown in FIGS. 6 and 7, the vehicle device further includes a buffer member 180 covering the portion of the fin portion 1112 close to the at least one first drain outlet 150*b* and a portion of the antenna bracket 170 to prevent the liquid from flowing to an area outside the drainage portion.

In some embodiments, as shown in FIG. 7, the vehicle device further includes a connecting member 190 connected between the portion of the fin portion 1112 close to the at least one first drain outlet 150*b* and the antenna bracket 170.

However, the above are only the preferred embodiments of the present disclosure, and should not be used to limit the scope of implementation of the present disclosure, that is, simple equivalent changes and modifications made in accordance with claims and description of the present disclosure are still within the scope of the present disclosure. In addition, any embodiment of the present disclosure or claim does not need to achieve all the objectives or advantages disclosed in the present disclosure. In addition, the abstract and the title are not intended to limit the scope of claims of the present disclosure.

What is claimed is:

1. A vehicle device, comprising:
a heat sink, having a drainage portion and an electronic component accommodating portion, wherein the drainage portion has a fan accommodating portion, the drainage portion has a fin portion adjacent to the fan accommodating portion, and the fin portion has a plurality of fins to define a plurality of drainage channels;
a retaining wall, isolating the drainage portion and the electronic component accommodating portion;
at least one electronic component, disposed over the electronic component accommodating portion;
a fan, disposed over the fan accommodating portion;
an upper cover, covering the heat sink, the retaining wall, the at least one electronic component and the fan, and having a plurality of through holes and at least one first drain outlet, wherein the through holes are aligned with the drainage portion, and the at least one first drain outlet is adjacent to an edge portion of the drainage portion and away from the fan;
an antenna bracket, disposed between a portion of the fin portion close to the at least one first drain outlet and a portion of the upper cover close to the at least one first drain outlet, wherein the antenna bracket has at least one fourth drain outlet facing the at least one first drain outlet; and
a buffer member, covering the portion of the fin portion close to the at least one first drain outlet and a portion of the antenna bracket;
wherein two ends of each of the plurality of fins are respectively close to the fan and the at least one first drain outlet.

2. The vehicle device of claim 1, wherein the retaining wall and the upper cover are integrally formed, or the retaining wall and the heat sink are integrally formed.

3. The vehicle device of claim 1, further comprising:
a cover plate, disposed between the fin portion of the drainage portion and the upper cover, and covering the fin portion of the drainage portion, wherein the through holes are aligned with the cover plate and the fan accommodating portion.

4. The vehicle device of claim 3, wherein the drainage portion further has a connection portion adjacent to the fin portion, and the connection portion has a slope portion and a pivot portion, and the slope portion is connected between the fin portion and the pivot portion, and the slope portion and the upper cover jointly define a second drain outlet.

5. The vehicle device of claim 4, wherein the cover plate further covers a portion of the slope portion close to the fin portion.

6. The vehicle device of claim 1, wherein the drainage portion further has a groove portion adjacent to the fan accommodating portion, and the groove portion has a third drain outlet penetrating the groove portion, and a bottom of the groove portion is lower than a bottom of the fan accommodating portion.

7. The vehicle device of claim 1, wherein the upper cover further has at least one first ventilation opening disposed over the at least one first drain outlet.

* * * * *